(12) United States Patent
Diaz et al.

(10) Patent No.: US 7,259,446 B2
(45) Date of Patent: Aug. 21, 2007

(54) HEAT SINK PACKAGING ASSEMBLY FOR ELECTRONIC COMPONENTS

(75) Inventors: Jose Diaz, Pembroke Pines, FL (US); George C. Anderson, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 103 days.

(21) Appl. No.: 11/213,200

(22) Filed: Aug. 25, 2005

(65) Prior Publication Data

US 2007/0045822 A1    Mar. 1, 2007

(51) Int. Cl.
    *H01L 23/495* (2006.01)
(52) U.S. Cl. ............... 257/675; 257/706; 257/E33.075
(58) Field of Classification Search .............. 257/706, 257/276, 625, 675, E33.075, E31.131, E23.051; 361/709
    See application file for complete search history.

(56) References Cited

U.S. PATENT DOCUMENTS

| 5,367,434 | A  | * | 11/1994 | Griffin et al. ............... 361/719 |
| 5,379,185 | A  | * | 1/1995  | Griffin et al. ............... 361/709 |
| 6,208,526 | B1 |   | 3/2001  | Griffin et al. |
| 6,842,341 | B1 | * | 1/2005  | Waldvogel et al. ......... 361/704 |

* cited by examiner

*Primary Examiner*—Long K. Tran
(74) *Attorney, Agent, or Firm*—Barbara R. Doutre

(57) ABSTRACT

A packaging assembly (100) includes a plurality of dissimilar die (102, 104, 106) bonded to a base board (110) and ground coupled to a heat sink (108) through an opening (132). A mating board (112) is coupled to the base board (110) to provide separate surface mountable contacts (148-158, 166) with which to independently bias each die (102, 104, 106) while the heat sink (108) provides thermal dissipation for the die. Assembly (100) provides a surface mountable package well suited to multiband applications.

5 Claims, 2 Drawing Sheets

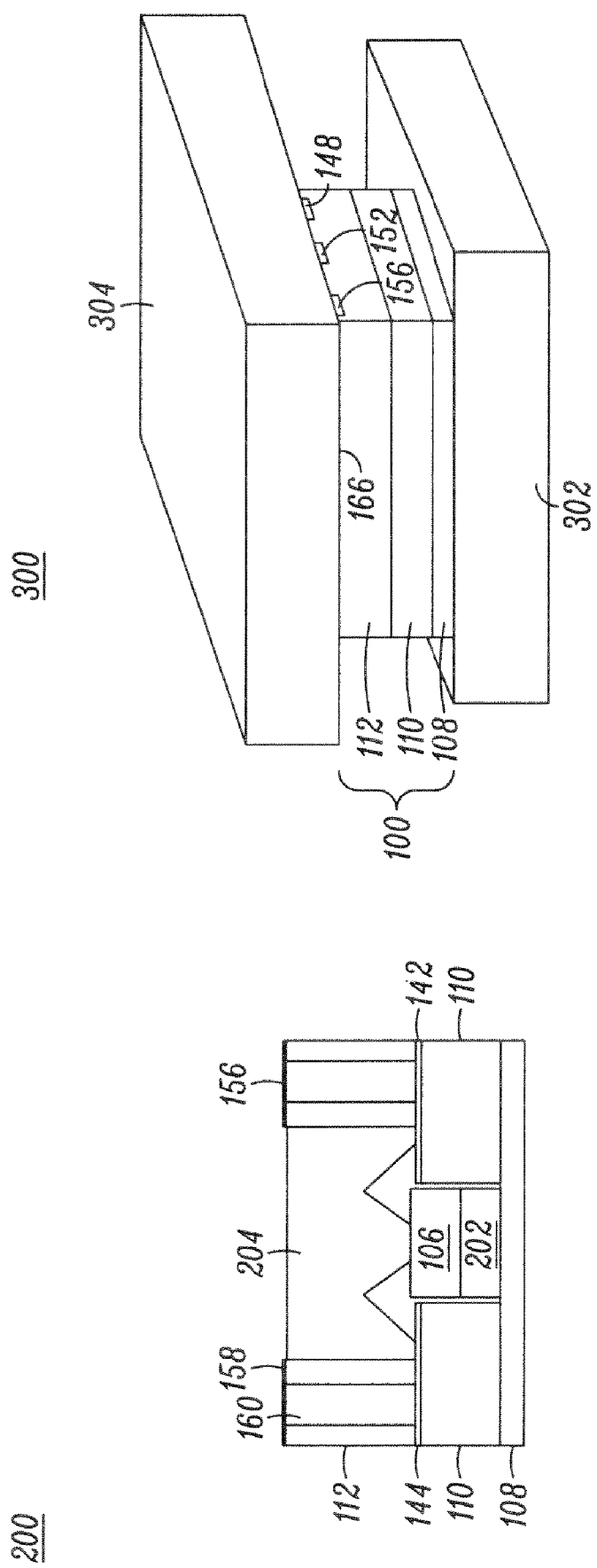

HEAT SINK PACKAGING ASSEMBLY FOR ELECTRONIC COMPONENTS

FIELD OF THE INVENTION

The present invention relates in general to electronic components and more particularly to the packaging and heat sinking of such components.

BACKGROUND OF THE INVENTION

Future portable radio products are being designed to accommodate multiband platforms providing operation over two or more frequency bands. A single handset that can seamlessly operate in the VHF, UHF and 700-800 MHz bands would be highly beneficial. One of the challenges in the transmitter section of such a product is to design a power amplifier that can operate from 100 MHz to 900 MHz.

One approach to the multiband challenge is to include complete amplifier lineups for each band and switch them in or out accordingly. While several components can be re-used in different bands, two or more final stage FETs are needed to cover all the bands which presents issues with packaging and thermal dissipation size relative to size, cost and space constraints.

One current multiband amplifier approach utilizes multiple substrates, individually tested and mounted in a common substrate-mounting frame. Another approach takes a single active device and several passive components comprising a single PA final stage with one set of pads for the RF signal. Both of these approaches, however, are limited in their ability to provide precise biasing and scaling in size.

Accordingly, there is a need for an improved packaging assembly for electronic components, and particularly an assembly that facilitates multiband applications.

BRIEF DESCRIPTION OF THE FIGURES

The accompanying figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

FIG. 2 is a cross sectional side view of the packaging assembly of FIG. 1 in accordance with the present invention; and FIG. 3 shows a partial view of a communication device incorporating the packaging assembly of the present invention.

DETAILED DESCRIPTION OF THE PREFERRED EMBODIMENT

Figure 1:
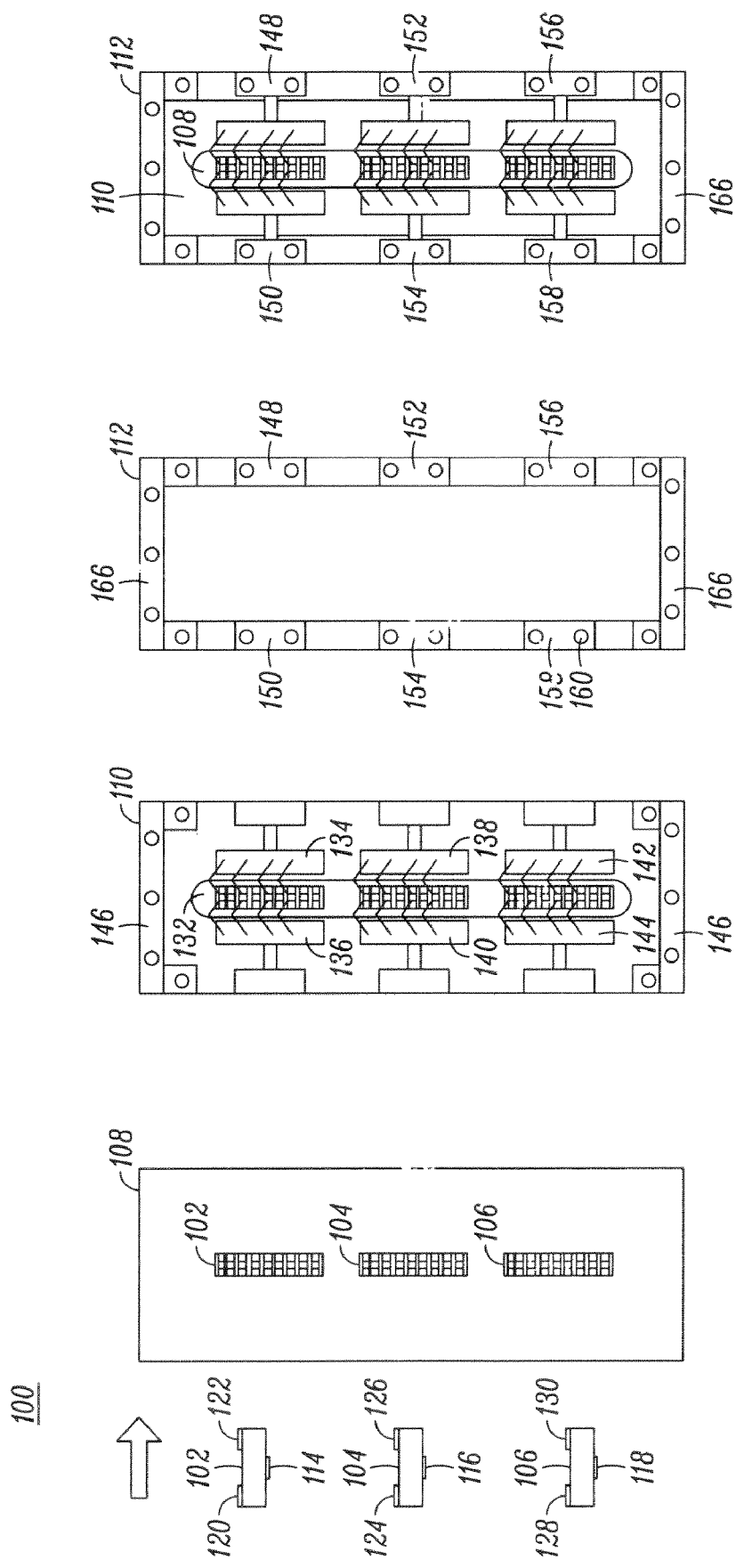
FIG. 1 shows an exploded view for a packaging assembly in accordance with the present invention.

Briefly in accordance with the present invention, there is provided herein a packaging assembly that enables a plurality of dissimilar die to be mounted in a single, surface mountable package utilizing only one point of chassis contact for heat sinking.

FIG. 1 shows an exploded view for a packaging assembly 100 in accordance with the present invention. Assembly 100 includes a plurality of dissimilar die 102, 104, 106 for mounting within a package comprising a heat sink 108, a base board 110 and a mating board 112. Each of the plurality of dissimilar die 102, 104, 106 includes a respective ground tab 114, 116, 118 and biasing contacts 120/122, 124/126 and 128/130. Each die source is attached to heat sink 108, the heat sink 108 providing ground.

Base board 110 includes an opening 132 formed therethrough and a plurality of bonding pads 134, 136, 138, 140, 142, 144 and ground vias 146. In accordance with the present invention, each die 102, 104, 106 is bonded to a corresponding bonding pad 134-144 and each bonding pad provides an independent biasing point for the biasing contacts of each die.

In accordance with the present invention, the mating board 112 provides perimeter contacts including independent biasing points 148, 150, 152, 154, 156, 158 corresponding to the die's biasing contacts 120-130. Vias, such as contact via 160 and ground vias 166, couple the mating board 112 to the base board 110.

FIG. 2 is a cross sectional side view of assembly 100 in accordance with the present invention. View 200 is taken across the metal contacts of biasing points 158, 156. As seen in this cross sectional view, the base board 110 is coupled to the heat sink 108. The die 106 is wire bonded to bonding pads 142, 144 of base board 110, and the die is coupled to heat sink 108 through a ground pedestal 202. The die 106 is enclosed in encapsulate 204.

Though only one, die 106, can be seen in view 200, each of the plurality of dissimilar die's biasing contacts 120/122, 124/126 and 128/130 are bonded to corresponding bonding pads 134/136, 138/140 and 142/144. The mating board 112 is coupled along the perimeter of the base board 110, here shown with via 160 joining the metal of contact bias point 158 to the metal of pad 144. Ground vias 146, 166, though not seen in this view, interconnect the base board 110 and mating board 112 to heat ink 108.

The multi-die package of the present invention provides a leadless, surface mount package containing multiple components, such as RF power transistors, that can be individually biased. When utilized in an RF power amplifier application, the different die can accommodate different operating frequencies and/or different operating powers. The ability to transmit two or more dissimilar bands at powers exceeding two watts in a compact package provides significant advantages to a radio handset required to operate over multiband frequencies and in which size and space constraint are of concern.

FIG. 3 shows a partial view of a communication device, such as a radio or the like, in accordance with the present invention. Communication device 300 includes a chassis 302 and a circuit board 304 between which is coupled a packaging assembly 100 formed in accordance with the present invention. In this embodiment, packaging assembly 100 is preferably a power amplifier package. Package 100 includes heat sink 108, base board 110 and mating board 112. Though not seen in this view, the plurality of dissimilar die are bonded to the base board 110 and ground coupled to the heat sink through the opening 132 in the baseboard. The heat sink 108 is coupled to the chassis 302 preferably through a thermal media, such as paste or tape. Mating board 112 is soldered to the circuit board 304 via independent contacts 148-158 and ground 166.

The plurality of dissimilar die, in this embodiment, dissimilar RF power transistors, can be individually biased and as such can accommodate different operating frequencies and/or different operating powers. Thus, communication device 300 provides multiband functionality with independently controllable biasing scaled within a single surface mountable package.

Accordingly, there has been provided an improved packaging assembly for electronic components. The packaging assembly of the present invention facilitates multiband applications by enabling entire power amplifier final stage die to be packaged in one assembly saving space and cost. Co-planarity issues are eliminated as only one point of chassis contact for heat sinking is required. The packaging assembly of the present invention also enables the proper device to be used at each band thereby increasing battery life and reducing radio heating during transmit mode of operation.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. An assembly, comprising:
   a plurality of dissimilar die, each die having a ground tab and biasing contacts;
   a heat sink;
   a base board coupled to the heat sink, the base board including an opening formed therethrough and a plurality of bonding pads and ground vias, each ground tab of the dissimilar die being coupled to the heat sink through the opening, each of the plurality of dissimilar die's biasing contacts being bonded to the plurality of bonding pads, the ground vias of the base board being coupled to the heat sink; and
   a mating board coupled along the perimeter of the base board, the mating board providing perimeter contacts including ground and independent biasing points for each of the biasing contacts, each of the plurality of biasing contacts being biased independently.

2. The assembly of claim 1, wherein the assembly operates as a multiband RF power amplifier.

3. A communication device, including:
   a chassis;
   a circuit board;
   a power amplifier package coupled between the chassis and the circuit board, the power amplifier package comprising:
   a heat sink;
   a base board coupled to the heat sink and having an opening formed therethrough;
   a mating board coupled to the base board; and
   a plurality of dissimilar die bonded to the base board and coupled to the heat sink through the opening of the baseboard; and
   wherein the heat sink is coupled to the chassis, and the mating board is coupled to the circuit board, the power amplifier package providing multiband functionality with independently controllable biasing scaled within a single surface mountable package.

4. The communication device of claim 3, wherein the communication device comprises a radio.

5. The communication device of claim 3, wherein the communication device is a multiband communication device.

* * * * *